(12) United States Patent
Wang et al.

(10) Patent No.: US 11,996,421 B2
(45) Date of Patent: May 28, 2024

(54) IMAGE SENSOR, MOBILE TERMINAL, AND IMAGE CAPTURING METHOD

(71) Applicant: VIVO MOBILE COMMUNICATION CO., LTD., Guangdong (CN)

(72) Inventors: Danmei Wang, Guangdong (CN); Huazhao Zhou, Guangdong (CN); Panpan Zhu, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 513 days.

(21) Appl. No.: 17/151,745

(22) Filed: Jan. 19, 2021

(65) Prior Publication Data

US 2022/0367541 A1 Nov. 17, 2022
US 2023/0069816 A9 Mar. 2, 2023

Related U.S. Application Data

(63) Continuation of application No. PCT/CN2019/095367, filed on Jul. 10, 2019.

(30) Foreign Application Priority Data

Jul. 19, 2018 (CN) .......................... 201810798680.4

(51) Int. Cl.
*H01L 27/146* (2006.01)
*G06F 1/16* (2006.01)

(52) U.S. Cl.
CPC .. *H01L 27/14605* (2013.01); *H01L 27/14629* (2013.01); *H01L 27/14634* (2013.01);
(Continued)

(58) Field of Classification Search
CPC ............. H01L 27/146; H01L 27/14603; H01L 27/14605; H01L 27/14607;
(Continued)

(56) References Cited

U.S. PATENT DOCUMENTS 7,196,391 B2 * 3/2007 Hsieh ................ H01L 27/14645
257/292
9,749,556 B2 * 8/2017 Fettig ................ H01L 27/14643
(Continued)

FOREIGN PATENT DOCUMENTS

CN 104969540 A 10/2015
CN 105611136 A 5/2016
(Continued)

OTHER PUBLICATIONS

European Search Report dated Jul. 14, 2021 issued in PCT/CN2019/095367.
(Continued)

*Primary Examiner* — Eduardo A Rodela
(74) *Attorney, Agent, or Firm* — Brooks Kushman P.C.

(57) ABSTRACT

Image sensor, mobile terminal, image capturing method are provided. Pixel array of image sensor includes preset quantity of pixel units, pixel unit includes first and second pixels that are dual pixel focusing pixels, first pixel includes red, green, and blue subpixels, second pixel includes green subpixel and infrared subpixel, and at least one of red and blue subpixels, and each subpixel is arranged in four-in-one manner; position of infrared subpixel in second pixel is same as position of red subpixel, green subpixel, blue subpixel, first combination of subpixels, or second combination of subpixels in first pixel; or position of half the infrared subpixel in second pixel is same as position of half the red subpixel, half the green subpixel, or half the blue subpixel in first pixel, and half an infrared subpixel in each of two adjacent second pixels is combined to form entire infrared subpixel.

12 Claims, 8 Drawing Sheets

| R | R | R | R | G | G | G | G | R | R | IR | IR | IR | IR | G | G |
|---|---|---|---|---|---|---|---|---|---|---|---|---|---|---|---|
| R | R | R | R | G | G | G | G | R | R | IR | IR | IR | IR | G | G |
| G | G | G | G | B | B | B | B | G | G | G | G | B | B | B | B |
| G | G | G | G | B | B | B | B | G | G | G | G | B | B | B | B |
| R | R | R | R | G | G | G | G | R | R | R | R | G | G | G | G |
| R | R | R | R | G | G | G | G | R | R | R | R | G | G | G | G |
| G | G | G | G | B | B | B | B | G | G | G | G | B | B | B | B |
| G | G | G | G | B | B | B | B | G | G | G | G | B | B | B | B |

(52) U.S. Cl.
CPC .... *H01L 27/14645* (2013.01); *H01L 27/1465* (2013.01); *G06F 1/1686* (2013.01)

(58) Field of Classification Search
CPC ......... H01L 27/14627; H01L 27/14625; H01L 27/14629; H01L 27/14634; H01L 27/14645; H01L 27/1465
See application file for complete search history.

(56) References Cited

U.S. PATENT DOCUMENTS

| | | | |
|---|---|---|---|
| 10,593,712 B2 * | 3/2020 | Borthakur | H01L 27/14627 |
| 10,629,105 B2 * | 4/2020 | Perreault | A61B 3/1015 |
| 10,686,004 B2 * | 6/2020 | Kato | H01L 27/14627 |
| 10,848,657 B2 * | 11/2020 | Park | H05K 1/144 |
| 11,004,884 B2 * | 5/2021 | Machida | H01L 27/14623 |
| 11,210,799 B2 * | 12/2021 | Jacobs | G06T 7/50 |
| 11,217,617 B2 * | 1/2022 | Akiyama | H01L 27/14621 |
| 11,404,454 B2 * | 8/2022 | Yen | H01L 27/14605 |
| 2011/0310276 A1 | 12/2011 | Lim et al. | |
| 2014/0008679 A1 * | 1/2014 | Deguchi | H01L 33/48 257/432 |
| 2014/0362368 A1 | 12/2014 | Kikuchi | |
| 2016/0205311 A1 | 7/2016 | Mandelli et al. | |
| 2016/0276396 A1 | 9/2016 | Tayanaka et al. | |
| 2017/0019583 A1 | 1/2017 | Kobayashi et al. | |
| 2017/0366798 A1 | 12/2017 | Bae et al. | |
| 2018/0316845 A1 | 11/2018 | Ouyang | |
| 2018/0350860 A1 | 12/2018 | Mao et al. | |

FOREIGN PATENT DOCUMENTS

| | | |
|---|---|---|
| CN | 106878690 A | 6/2017 |
| CN | 107040724 A | 8/2017 |
| CN | 107533210 A | 1/2018 |
| CN | 108965704 A | 12/2018 |
| JP | 2017038311 A | 2/2017 |
| WO | 2012032911 A1 | 3/2012 |

OTHER PUBLICATIONS

Written Opinion and Internation Search report received for PCT/CN2019/095367, Jan. 28, 2021, 9 pages and 6 pages of Translation.

* cited by examiner

IMAGE SENSOR, MOBILE TERMINAL, AND IMAGE CAPTURING METHOD

CROSS-REFERENCE TO RELATED APPLICATIONS

This application is continuation application of PCT International Application No. PCT/CN2019/095367 filed on Jul. 10, 2019, which claims priority to Chinese Patent Application No. 201810798680.4 filed on Jul. 19, 2018 in China, the disclosures of which are incorporated in their entireties by reference herein.

TECHNICAL FIELD

The present disclosure relates to the field of image processing technologies, and in particular, to an image sensor, a mobile terminal, and an image capturing method.

BACKGROUND

Among related technologies, smart electronic products have gradually become necessities in lives of people, and a camera function, as an important configuration of the electronic products, is also gradually developing. However, with the promotion and popularization of the camera function, people are no longer satisfied with an only camera function of a camera in a current smart electronic product, and expect to achieve diversified camera effects, diversified playing methods, and diversified functions.

On the market, among pixel array arrangements of an image sensor based on a complementary metal oxide semiconductor (Complementary Metal Oxide Semiconductor, CMOS), there is a commonly used four-in-one pixel array arrangement mode improved based on the Bayer mode of red (Red, R), green (Green, G), and blue (Blue, B). As shown in FIG. 1a and FIG. 1B, although this arrangement mode can be used to improve a dark-state photographing effect compared to the Bayer mode, a disadvantage is that an object distance cannot be detected, and this arrangement mode can only be used to receive natural light, for taking pictures and recording images during normal lighting.

A pixel array arrangement mode of a dual pixel focusing 2PD technology is shown in FIG. 1c and FIG. 1d. Such an arrangement mode can also only be used to accept natural light and used to take pictures and record images. Compared with a technical solution of a four-in-one RGB arrangement, such an arrangement mode may be used to detect an object distance and complete a focusing action more quickly, but has a non-ideal dark-state photographing effect.

A principle of a 2PD phase detection technology is described as follows: As seen from FIG. 1c and FIG. 1d, each of some R, G and B subpixels in a pixel array is divided into two, and obtains different light energy according to different incident directions, so that a left subpixel point and a right subpixel point form a phase detection pair. When a luminance value of the left subpixel point and a luminance value of the right subpixel point both reach a relative maximum peak value, an image is relatively the clearest at this moment, that is, in focus, and then an object distance is obtained through calculation by using an algorithm, to achieve fast focusing.

In summary, the pixel array arrangement mode of the image sensor in the related technologies has the problem of slow focusing or inability to improve the dark-state capturing effect, thereby affecting capturing experience of users.

SUMMARY

Embodiments of the present disclosure provide an image sensor, a mobile terminal, and an image capturing method, to resolve a problem that slow focusing is performed or a dark-state capturing effect cannot be improved in a pixel array arrangement mode of the image sensor in related technologies, thereby affecting capturing experience of users.

According to a first aspect, an embodiment of the present disclosure provides an image sensor, including:

a pixel array, where the pixel array includes a preset quantity of pixel units arranged in a predetermined manner, the pixel unit includes a first pixel and a second pixel adjacent to the first pixel, the first pixel includes a red subpixel, a green subpixel, and a blue subpixel, the second pixel comprises the green subpixel, and an infrared subpixel, and at least one of the red subpixel or the blue subpixel, both the first pixel and the second pixel are dual pixel focusing pixels, and each subpixel in the first pixel and the second pixel is arranged in a four-in-one manner; where a position of the infrared subpixel in the second pixel is the same as a position of the red subpixel, the green subpixel, the blue subpixel, a first combination of subpixels, or a second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other; or a position of half the infrared subpixel in the second pixel is the same as a position of half the red subpixel, half the green subpixel, or half the blue subpixel in the first pixel, and half an infrared subpixel in each of two adjacent second pixels is combined to form the entire infrared subpixel.

According to a second aspect, an embodiment of the present disclosure provides a mobile terminal, including an imaging system and an infrared transmit module, where the imaging system includes:

the image sensor;
a lens module;
a driver module configured to drive the lens module to move;
a filtering module disposed between the lens module and the image sensor;
an image data processing module connected to the image sensor; and
a display module connected to the image data processing module, where the infrared transmit module is disposed on a periphery of the lens module.

According to a third aspect, an embodiment of the present disclosure further provides an image capturing method, applied to a mobile terminal, where the mobile terminal includes an infrared transmit module and the image sensor, and the method includes:

transmitting infrared light by using the infrared transmit module;
obtaining a distance between each infrared light reflection point on a to-be-captured object and the mobile terminal based on infrared light reflected by the to-be-captured object; and
obtaining three-dimensional information of the to-be-captured object based on the distance between each infrared light reflection point on the to-be-captured object and the mobile terminal.

In the technical solutions of the present disclosure, the image sensor is formed by using a 2PD pixel array combining an RGB subpixel and an infrared subpixel that are in a four-in-one arrangement. Capturing is performed by using the image sensor, and a distance between the to-be-captured object and the mobile terminal may be detected when an image is captured and recorded, thereby achieving fast focusing and bokeh. In addition, a dark-state imaging effect of the image can be improved, and a related application function of stereophotographing is implemented, thereby ensuring functional diversity of the mobile terminal while capturing experience of a user is ensured.

BRIEF DESCRIPTION OF DRAWINGS

The following clearly describes the technical solutions in the embodiments of the present disclosure with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure without creative efforts shall fall within the protection scope of the present disclosure.

Figures 2B, 2C:
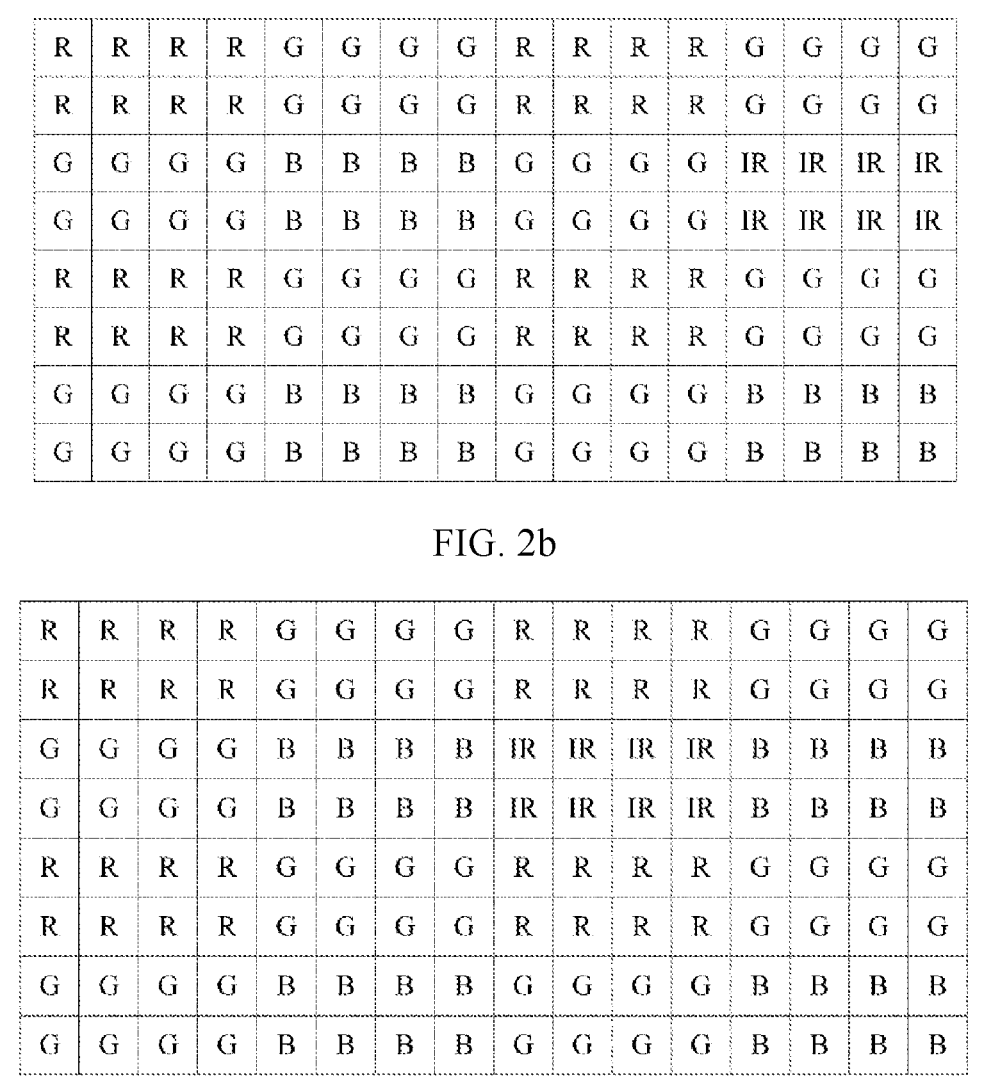

FIG. 2b is a schematic diagram 2 of a pixel unit according to an embodiment of the present disclosure;

FIG. 2c is a schematic diagram 3 of a pixel unit according to an embodiment of the present disclosure;

FIG. 3a is a schematic diagram 4 of a pixel unit according to an embodiment of the present disclosure;

FIG. 3b is a schematic diagram 5 of a pixel unit according to an embodiment of the present disclosure;

FIG. 4a is a schematic diagram 6 of a pixel unit according to an embodiment of the present disclosure;

FIG. 4b is a schematic diagram 7 of a pixel unit according to an embodiment of the present disclosure;

FIG. 5a is a schematic diagram 8 of a pixel unit according to an embodiment of the present disclosure;

DESCRIPTION OF EMBODIMENTS

Figures 1A, 1B:
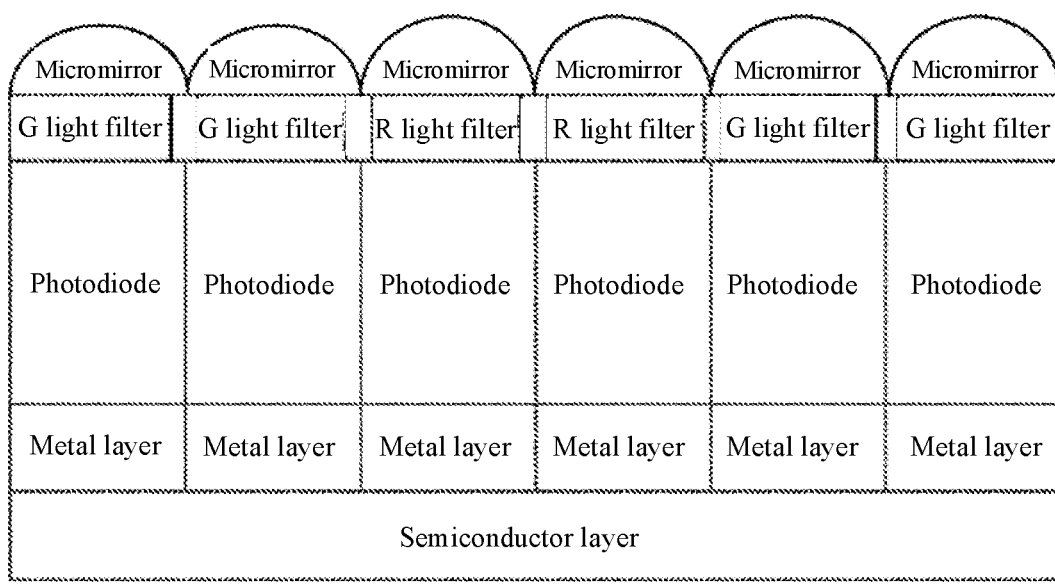
FIG. 1a is a schematic diagram of a four-in-one RGB arrangement in a related technology.
FIG. 1B is a sectional view of a four-in-one pixel.
Figures 1C, 1D, 2A:
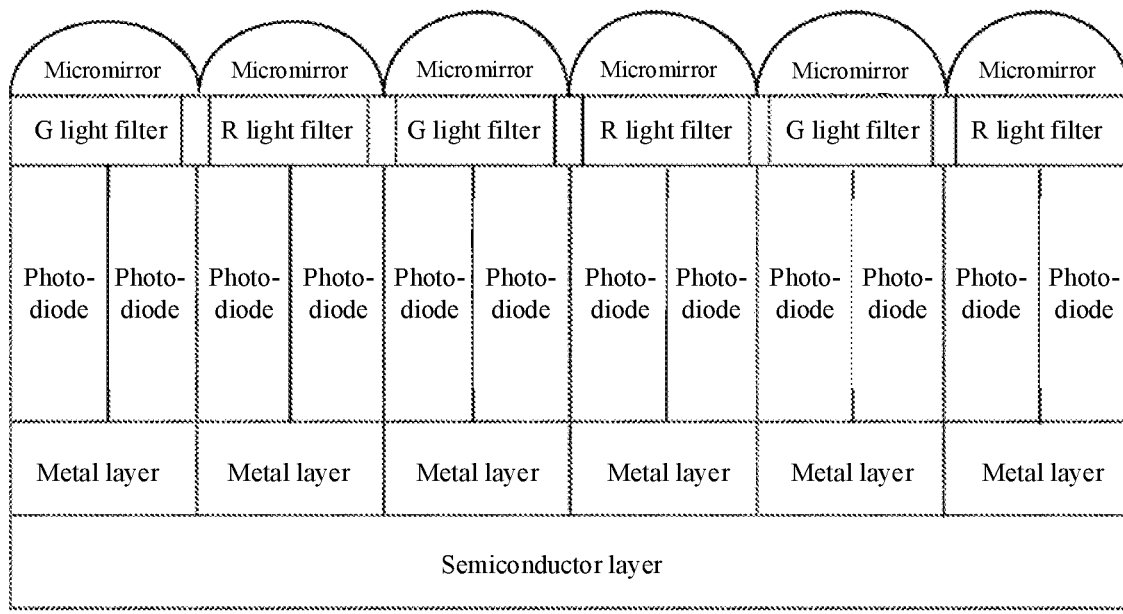
FIG. 1c is an arrangement diagram of a 2PD pixel array.
FIG. 1d is a sectional view of a 2PD pixel.
FIG. 2a is a schematic diagram 1 of a pixel unit according to an embodiment of the present disclosure.

The following clearly and completely describes the technical solutions in the embodiments of the present disclosure with reference to the accompanying drawings in the embodiments of the present disclosure. Apparently, the described embodiments are some rather than all of the embodiments of the present disclosure. All other embodiments obtained by a person of ordinary skill in the art based on the embodiments of the present disclosure without creative efforts shall fall within the protection scope of the present disclosure.

An embodiment of the present disclosure provides an image sensor, including:

a pixel array, where the pixel array includes a preset quantity of pixel units arranged in a predetermined manner, the pixel unit includes a first pixel and a second pixel adjacent to the first pixel, as shown in FIG. 2a to FIG. 2c, FIG. 3a and FIG. 3b, and FIG. 4a and FIG. 4b, the first pixel includes a red subpixel, a green subpixel, and a blue subpixel, the second pixel includes the green subpixel, an infrared subpixel, and at least one of the red subpixel or the blue subpixel, both the first pixel and the second pixel are dual pixel focusing pixels, and each subpixel in the first pixel and the second pixel is arranged in a four-in-one manner, where a position of the infrared subpixel in the second pixel is the same as a position of the red subpixel, the green subpixel, the blue subpixel, a first combination of subpixels, or a second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other; or a position of half the infrared subpixel in the second pixel is the same as a position of half the red subpixel, half the green subpixel, or half the blue subpixel in the first pixel, and half an infrared subpixel in each of two adjacent second pixels is combined to form the entire infrared subpixel.

The pixel array included in the image sensor provided in this embodiment of the present disclosure includes the preset quantity of pixel units, and the preset quantity of pixel units are arranged in the predetermined manner. Each of the preset quantity of pixel units includes the first pixel and the second pixel. The first pixel is different from the second pixel. The first pixel includes the red subpixel (R), the green subpixel (G), and the blue subpixel (B). In addition to at least one of the red subpixel or the blue subpixel, the second pixel further includes the green subpixel and the infrared subpixel (IR). When the infrared light is received, an image may be captured by disposing the infrared subpixel in the second pixel, thereby implementing dark-state imaging, and ensuring capturing experience of a user.

Each of the first pixel and the second pixel in this embodiment of the present disclosure is a dual pixel focusing (2PD) pixel, and an object distance may be detected by using the 2PD pixel, to complete a focusing action more quickly. Herein both the first pixel and the second pixel are 2PD pixels, that is, the subpixels in the first pixel and the second pixel are all 2PD subpixels. In addition, all the subpixels in the first pixel and the second pixel are arranged in a four-in-one manner. Based on the four-in-one arrangement, one subpixel includes 4 corresponding units, and a structure of the 4 units is as follows: Two units are located at an upper layer, the other two units are located at a lower layer, and the two units at the lower layer are arranged in a manner corresponding to the two units at the upper layer. That is, the first unit and the second unit are sequentially arranged and adjacent to each other, a third unit is located below the first unit, and a fourth unit is located below the second unit.

In addition, because the subpixel is the 2PD subpixel, each unit is divided into two. For example, the red subpixel includes four red units, the green subpixel includes four green units, the blue subpixel includes four blue units, and each unit is divided into two.

The red subpixel, the green subpixel, and the blue subpixel that are in the first pixel are arranged in a certain way, and the first pixel includes one red subpixel, one blue subpixel, and two green subpixels. Herein, for distinguishing, the two green subpixels are respectively referred to as a first green subpixel and a second green subpixel, where the first green subpixel is the same as the second green subpixel. The red subpixel is adjacent to the first green subpixel, the second green subpixel is below the red subpixel, the blue subpixel is below the first green subpixel, and the second green subpixel is adjacent to the blue subpixel.

In addition to at least one of the red subpixel or the blue subpixel, the second pixel further includes the green subpixel and the infrared subpixel. That is, the second pixel may include the red subpixel, the green subpixel, and the infrared subpixel, or may include the green subpixel, the blue subpixel, and the infrared subpixel, or may include the green subpixel, the red subpixel, the blue subpixel, and the infrared subpixel.

The position of the infrared subpixel in the second pixel may be the same as a position of a subpixel in the first pixel, or a position of half of each of two different adjacent subpixels in the first pixel. Certainly, the position of half the infrared subpixel in the second pixel may be further the same as a position of half of any subpixel in the first pixel. In this case, half of an infrared subpixel in two adjacent second pixels can be combined to form an entire infrared subpixel. For example, the position of half the infrared subpixel in the second pixel is the same as the position of half the red subpixel in the first pixel. In addition, the position of half the infrared subpixel in the second pixel is the same as the position of half the green subpixel in the first pixel. So far, half an infrared subpixel in two adjacent second pixels may be combined to form an entire infrared subpixel.

In this embodiment of the present disclosure, an RGB pixel array arrangement mode is improved to a four-in-one RGB-infrared (Infrared Radiation, IR) pixel array arrangement mode, so that the mobile terminal captures an image when receiving infrared light, thereby implementing darkstate imaging, and ensuring capturing experience of a user.

In addition, the image sensor in this embodiment of the present disclosure may detect a distance between a to-becaptured object and the mobile terminal, thereby implementing rapid focusing and bokeh. In addition, through cooperation with an infrared transmit module, an imaging effect of the image can be improved, and a related application function of stereophotographing is implemented, thereby enhancing functionality of the mobile terminal while capturing experience of a user is ensured.

In this embodiment of the present disclosure, as shown in FIG. 2a to FIG. 2c, FIG. 3a, and FIG. 3b, the position of the infrared subpixel in the second pixel is the same as the position of the red subpixel, the green subpixel, the blue subpixel, the first combination of subpixels, or the second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other.

When the second pixel includes the blue subpixel, the green subpixel, and the infrared subpixel, the infrared subpixel replaces the red subpixel in the first pixel. In this case, the position of the infrared subpixel in the second pixel is the same as the position of the red subpixel in the first pixel.

When the second pixel includes the red subpixel, the green subpixel, and the infrared subpixel, the infrared subpixel replaces the blue subpixel in the first pixel. In this case, the position of the infrared subpixel in the second pixel is the same as the position of the blue subpixel in the first pixel.

When the second pixel includes the red subpixel, the green subpixel, the blue subpixel, and the infrared subpixel, the infrared subpixel may replace one green subpixel in the first pixel. In this case, the position of the infrared subpixel in the second pixel is the same as the position of the one green subpixel in the first pixel.

That the second pixel includes the red subpixel, the green subpixel, the blue subpixel, and the infrared subpixel may be further that the second pixel includes one red subpixel, one green subpixel, half a blue subpixel, half a green subpixel, and one infrared subpixel. In this case, the infrared subpixel replaces half a green subpixel and half a blue subpixel in the first pixel, that is, the position of the infrared subpixel in the second pixel is the same as a position of half the green subpixel and half the blue subpixel that are adjacent in the first pixel.

That the second pixel includes the red subpixel, the green subpixel, the blue subpixel, and the infrared subpixel may also be that the second pixel includes one blue subpixel, one green subpixel, half a red subpixel, half a green subpixel, and one infrared subpixel. In this case, the infrared subpixel replaces half a green subpixel and half a red subpixel in the first pixel, that is, the position of the infrared subpixel in the second pixel is the same as a position of half the green subpixel and half the red subpixel that are adjacent in the first pixel.

Based on the foregoing embodiment, when the position of the infrared subpixel in the second pixel is the same as the position of the red subpixel, the green subpixel, the blue subpixel, the first combination of subpixels, or the second combination of subpixels in the first pixel, the pixel unit includes one second pixel and at least one first pixel.

If the position of the infrared subpixel in the second pixel is the same as the position of the red subpixel, the green subpixel, the blue subpixel, the first combination of subpixels, or the second combination of subpixels in the first pixel, a quantity of second pixels in the pixel unit is one, and a quantity of first pixels may be greater than or equal to one. When the pixel unit includes one second pixel and one first pixel, referring to an example shown in FIG. 5a, the pixel unit includes one first pixel and one second pixel. The second pixel includes one red subpixel, two green subpixels, and one infrared subpixel, and the first pixel includes one red subpixel, two green subpixels, and one blue subpixel. In this case, the infrared subpixel accounts for ⅛ of the pixel unit. It should be noted that the subpixels herein are all arranged in a four-in-one manner, each subpixel includes four corresponding units, and each unit is divided into two.

When the pixel unit includes two first pixels and one second pixel, the second pixel may include one blue subpixel, two green subpixels, and one infrared subpixel, and the first pixel includes one red subpixel, two green subpixels, and one blue subpixel. In this case, the infrared subpixel accounts for 1/12 of the pixel unit. The subpixels herein are all arranged in a four-in-one manner, each subpixel includes four corresponding units, and each unit is divided into two.

Figures 3A, 3B:
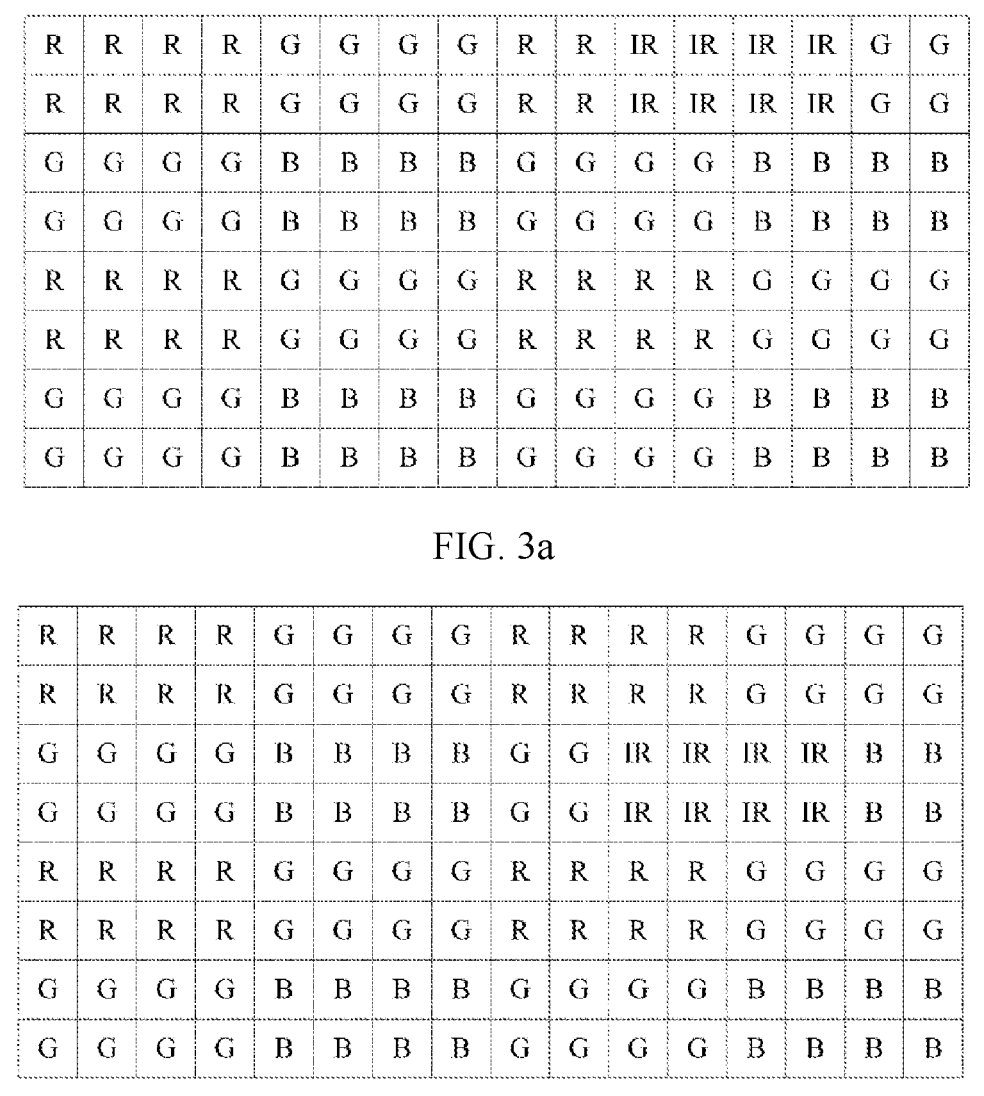

When the pixel unit includes three first pixels and one second pixel, for example, as shown in FIG. 3a, the pixel unit includes three first pixels and one second pixel. The second pixel includes one blue subpixel, one green subpixel, half a red subpixel, half a green subpixel, and one infrared subpixel. Half a red subpixel and half a green subpixel among 2PD subpixels may be taken as the infrared subpixel based on the first pixel. The first pixel includes one red subpixel, two green subpixels, and one blue subpixel. In this case, the infrared subpixel accounts for 1/16 of the pixel unit. The subpixels herein are arranged in a four-in-one manner, each subpixel includes four corresponding units, and each unit is divided into two.

The foregoing corresponding point-taking manners are only used for illustration, and other points-taking manners may also be used, which are not described one by one herein.

Figures 4A, 4B, 5A:
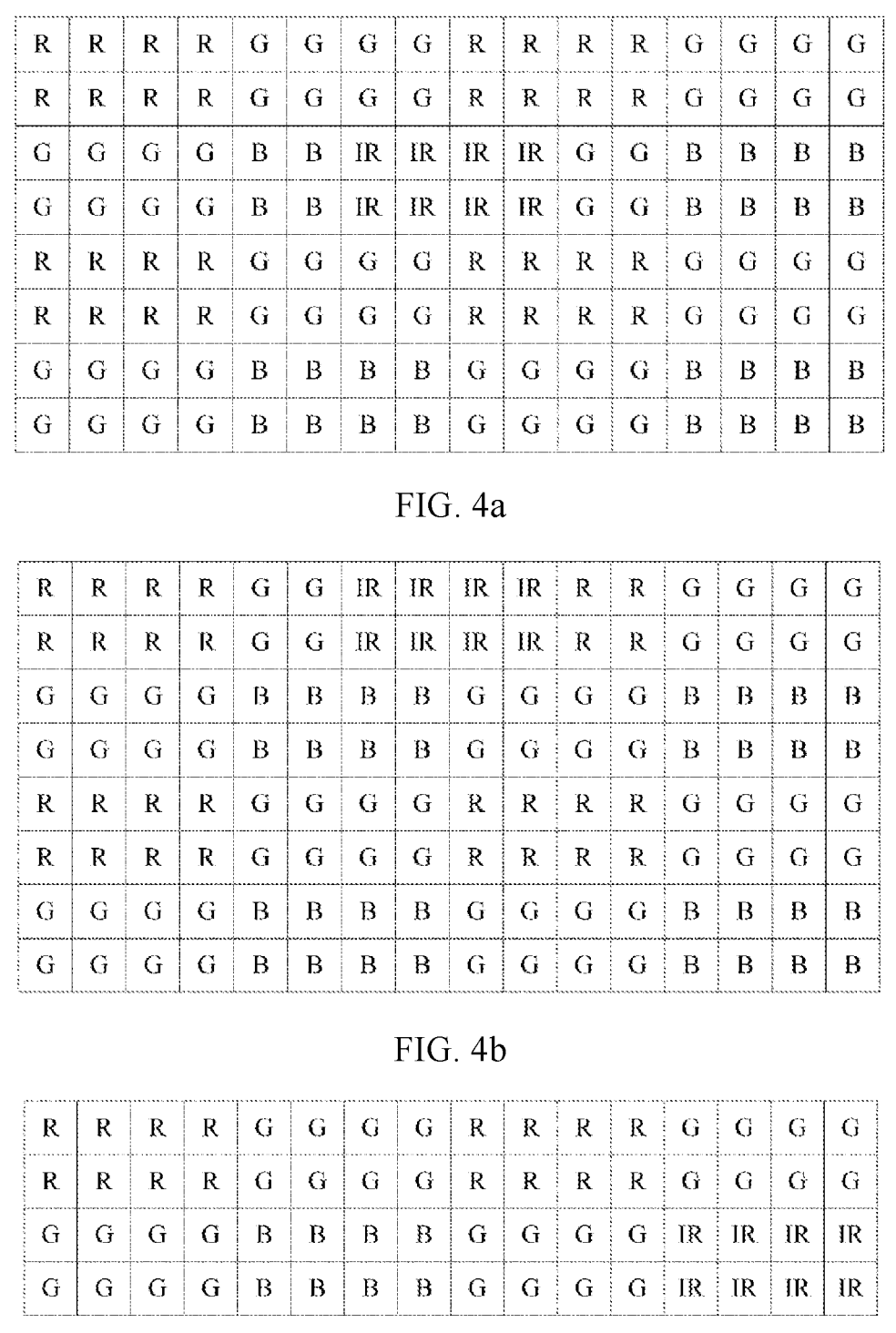

In this embodiment of the present disclosure, as shown in FIG. 4a and FIG. 4b, a position of half an infrared subpixel in the second pixel is the same as a position of half a red subpixel, half a green subpixel, or half a blue subpixel in the first pixel, and half an infrared subpixel in each of two adjacent second pixels is combined to form an entire infrared subpixel.

The second pixel may include only half an infrared subpixel, and an entire infrared subpixel may be obtained by combining two second pixels.

When the second pixel includes half the infrared subpixel, the position of half the infrared subpixel in the second pixel may be the same as a position of half a red subpixel in the first pixel, or may be the same as a position of half a green subpixel in the first pixel, or may be the same as a position of half a blue subpixel in the first pixel.

When a position of half an infrared subpixel in one second pixel is the same as a position of half a red subpixel in the first pixel, a position of half an infrared subpixel in another second pixel is the same as a position of half a green subpixel in the first pixel. When a position of half an infrared subpixel in one second pixel is the same as a position of half a green subpixel in the first pixel, a position of half an infrared subpixel in another second pixel is the same as a position of half a blue subpixel or half a red subpixel in the first pixel.

Correspondingly, when the position of half the infrared subpixel in the second pixel is the same as the position of half the red subpixel, half the green subpixel, or half the blue subpixel in the first pixel, and half an infrared subpixel in each of two adjacent second pixels is combined to form the entire infrared subpixel, the pixel unit includes two second pixels and the first pixel whose quantity is greater than or equal to zero.

Figures 5B, 6:
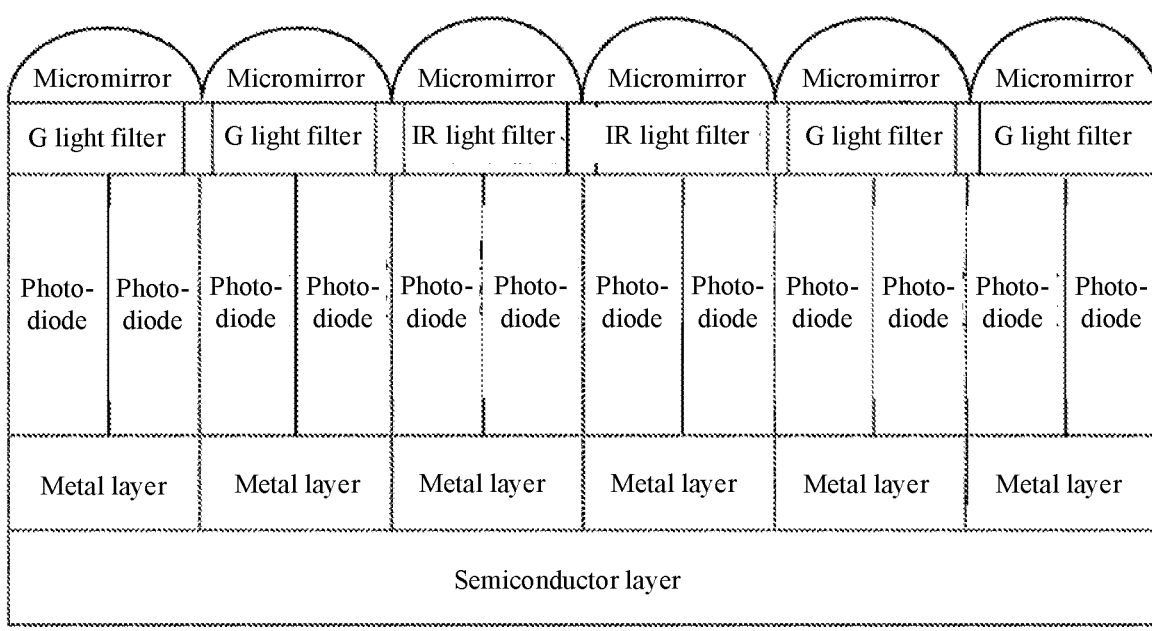
FIG. 5b is a schematic diagram 9 of a pixel unit according to an embodiment of the present disclosure.
FIG. 6 is a sectional view of a pixel according to an embodiment of the present disclosure.

When a quantity of pixels in the pixel unit is at least two, the pixel unit includes two second pixels and the first pixel whose quantity is greater than or equal to zero. When the quantity of pixels in the pixel unit is two, two second pixels are included. For example, as shown in FIG. 5b, the pixel unit includes two second pixels. One second pixel includes one red subpixel, one green subpixel, one blue subpixel, half a green subpixel, and half an infrared subpixel. The other second pixel includes one red subpixel, two green subpixels, half a blue subpixel, and half an infrared subpixel. In this case, when a position of half an infrared subpixel in one second pixel is the same as a position of half a green subpixel in the first pixel, a position of half an infrared subpixel in the other second pixel is the same as a position of half a blue subpixel in the first pixel. The infrared subpixel accounts for 1/8 of the pixel unit.

When the quantity of pixels in the pixel unit is three, two second pixels and one first pixel are included. For example, the pixel unit includes two second pixels and one first pixel. One second pixel includes one red subpixel, one green subpixel, one blue subpixel, half a green subpixel, and half an infrared subpixel. The other second pixel includes half a red subpixel, two green subpixels, one blue subpixel, and half an infrared subpixel. In this case, a position of half the infrared subpixel in the one second pixel is the same as a position of half a green subpixel in the first pixel, and a position of half the infrared subpixel in the other second pixel is the same as a position of half a red subpixel in the first pixel. The infrared subpixel accounts for 1/12 of the pixel unit.

When the quantity of pixels in the pixel unit is four, two second pixels and two first pixels are included. For example, as shown in FIG. 4b, the pixel unit includes two second pixels and two first pixels. One second pixel includes one red subpixel, one green subpixel, one blue subpixel, half a green subpixel, and half an infrared subpixel. The other second pixel includes one blue subpixel, two green subpixels, half a red subpixel, and half an infrared subpixel. In this case, when a position of half the infrared subpixel in the one second pixel is the same as a position of half a green subpixel in the first pixel, a position of half the infrared subpixel in the other second pixel is the same as a position of half a red subpixel in the first pixel. The infrared subpixel accounts for 1/16 of the pixel unit. The subpixels herein are all arranged in a four-in-one manner, each subpixel includes four corresponding units, and each unit is divided into two.

An RGB+IR pixel unit with a proportion of 1/8, an RGB+IR pixel unit with a proportion of 1/12, or an RGB+IR pixel unit with a proportion of 1/16 may be used as a pixel unit array, and a periodic array arrangement is performed on the pixel unit array to form the pixel array. Certainly, the pixel array may be in another form, which is not listed herein.

Density of infrared subpixels in the pixel unit (that is, a proportion) is 1/4n, n is an integer greater than or equal to 2, and a size of the pixel array to which the infrared subpixel is applicable is not limited. Only a few corresponding point taking implementations of the infrared subpixel are described above, and other point taking manners may be further used. The other point taking manners in the embodiments of the present disclosure are not described one by one herein. A point taking position of the infrared subpixel in the pixel unit (the location of the second pixel) is not specifically limited in this embodiment of the present disclosure.

For a form of the forgoing pixel unit, a four-in-one red, green, or blue subpixel among the 2PD subpixels may be used as the infrared subpixel, to facilitate form diversification of the pixel unit; or half a four-in-one red subpixel and half a four-in-one green subpixel among the 2PD subpixels or half a four-in-one blue subpixel and half a four-in-one green subpixel may be used as the infrared subpixel, so that impact of IR dead pixels during RGB processing can be reduced.

In this embodiment of the present disclosure, the red subpixel includes a semiconductor layer, a metal layer, a photodiode, a red light filter, and a micromirror that are sequentially stacked. The green subpixel includes a semiconductor layer, a metal layer, a photodiode, a green light filter, and a micromirror that are sequentially stacked. The blue subpixel includes a semiconductor layer, a metal layer, a photodiode, a blue light filter, and a micromirror that are sequentially stacked. The infrared subpixel includes a semiconductor layer, a metal layer, a photodiode, an infrared light filter, and a micromirror that are sequentially stacked.

The semiconductor layer, the metal layer, the photodiode, the red light filter, and the micromirror that are included in the red subpixel are sequentially arranged from bottom to top. The semiconductor layer, the metal layer, the photodiode, the green light filter, and the micromirror that are included in the corresponding green subpixel are sequentially arranged from bottom to top. The semiconductor layer, the metal layer, the photodiode, the blue light filter, and the micromirror that are included in the blue subpixel are sequentially arranged from bottom to top. The semiconductor layer, the metal layer, the photodiode, the infrared filter, and the micromirror included in the infrared subpixel are sequentially arranged from bottom to top. The semiconductor layer herein may be a silicon substrate. However, the present disclosure is not limited thereto. For structures of the red, green, blue, and infrared subpixels, refer to FIG. 6. Even though FIG. 6 shows only the green and infrared subpixels, the structures of the red and blue subpixels may be obtained on this basis. The green light filter may be replaced with the red or blue light filter, so that the structures of the red subpixel or the blue subpixel can be obtained.

The red, green, and blue subpixels are used to obtain color information of pixels for synthesizing an image, and block infrared light from entering. For example, visible light with a wavelength of only 380 mm to 700 nm is allowed to enter, and an image with full and vivid colors can be directly generated under high illumination. An infrared wavelength is 750 nm to 1100 nm, and a dark-state imaging effect can be improved by using an infrared band, thereby implementing an infrared distance measurement function.

As can be seen from the above description, an RGB subpixel point is a light receiving element corresponding to wavelength light in each RGB color, and an IR subpixel point is a light receiving element corresponding to infrared light.

In this embodiment of the present disclosure, the image sensor is a complementary metal oxide semiconductor CMOS image sensor, a charge-coupled device CCD image sensor, or a quantum film image sensor.

In the present disclosure, types of image sensors to which the four-in-one RGB-IR pixel array arrangement mode is applicable are not limited. The image sensor may be an image sensor based on a CMOS, an image sensor based on a charge-coupled device (Charge-coupled Device, CCD), or an image sensor based on a quantum film. Certainly, the image sensor may be further of another type. In addition, the image sensor in this embodiment of the present disclosure is applicable to any electronic product including a camera module.

Figure 7A:
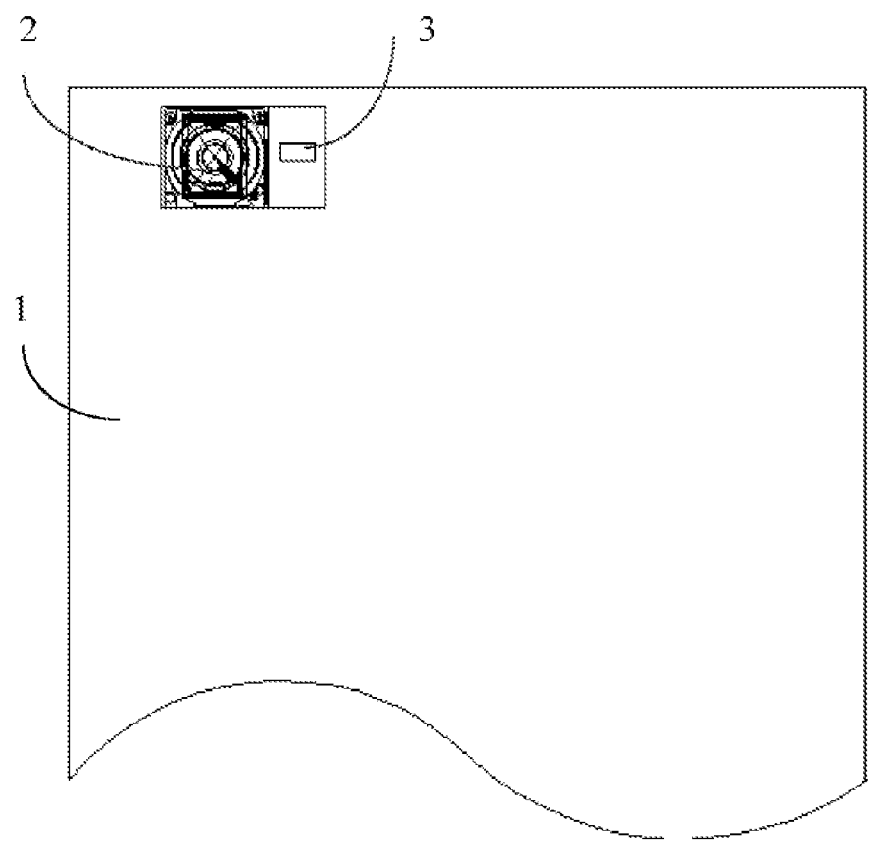
FIG. 7a is a schematic diagram of a mobile terminal according to an embodiment of the present disclosure.
Figure 7B:
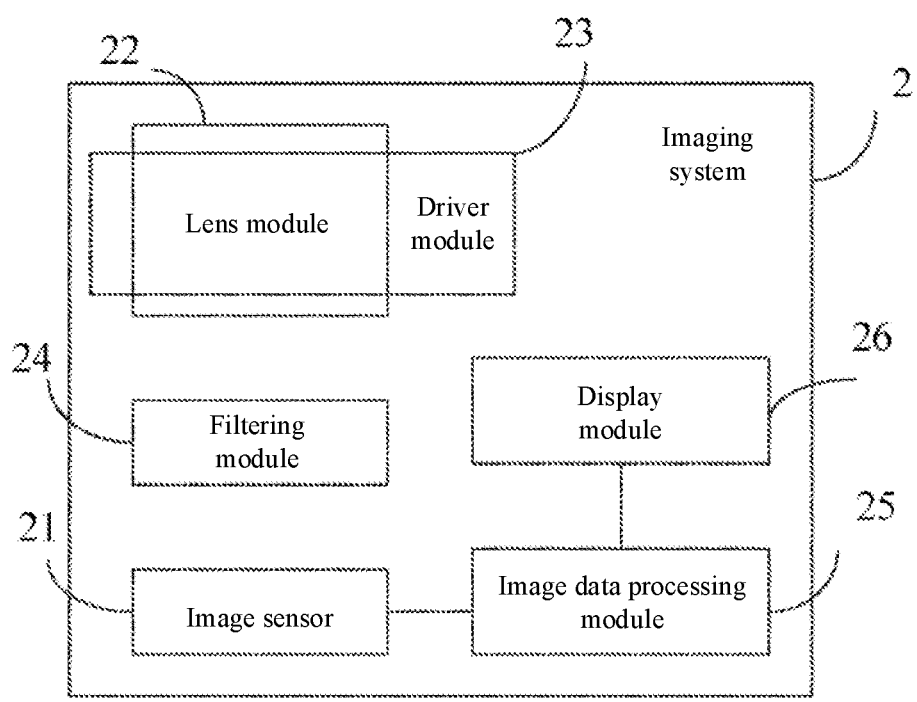
FIG. 7b is a schematic diagram of an imaging system according to an embodiment of the present disclosure.

An embodiment of the present disclosure further provides a mobile terminal. As shown in FIG. 7a and FIG. 7b, the mobile terminal 1 includes an imaging system 2 and an infrared transmit module 3. In addition to the foregoing image sensor 21, the imaging system 2 further includes:

a lens module 22; a driver module 23 configured to drive the lens module 22 to move; a filtering module 24 disposed between the lens module 22 and the image sensor 21; an image data processing module 25 connected to the image sensor 21; and a display module 26 connected to the image data processing module 25, where the infrared transmit module 3 is disposed on a periphery of the lens module 22.

In addition to the imaging system 2, the mobile terminal 1 in this embodiment of the present disclosure further includes the infrared transmit module 3. In addition to the image sensor 21, the imaging system 2 further includes the lens module 22 configured to focus light. The lens module 22 is connected to the driver module 23, and the driver module 23 is configured to adjust a position of the lens module 22 based on a distance to a to-be-captured object.

The filtering module 24 is disposed between the lens module 22 and the image sensor 21. After light is focused by using the lens module 22 and passes through the filtering module 24, the light may be focused on a pixel array of the image sensor 21. The image sensor 21 is connected to the image data processing module 25, and the image data processing module 25 is connected to the display module 26. After the light is focused on the pixel array of the image sensor 21, and the image sensor 21 performs photovoltaic conversion on the light, data is transmitted to the image data processing module 25. After the image data processing module 25 processes the data, the data is presented on the display module 26 in an image form.

After adjusting the position of the lens module 22, the driver module 23 may obtain a phase difference by using a 2PD pixel of the image sensor 21, to obtain a distance between an object and an imaging surface, thereby implementing fast focusing.

In addition, the four-in-one RGB+IR pixel array arrangement mode based on the 2PD image sensor in the present disclosure can cooperate with the infrared transmit module 3 to achieve a stereo-related function, such as terminal application like face recognition and unlocking, secure payment, and stereo imaging, thereby improving functionality of the mobile terminal on the basis of ensuring imaging.

The filtering module 24 in this embodiment of the present disclosure can pass through a light wavelength from 380 nm to 1100 nm. In this case, after the light is focused by using the lens module 22, the light can be filtered by using the filtering module 24. Natural light and infrared light can pass through the filtering module 24, and the filtering module 24 can be configured to ensure an imaging effect of the imaging system 2.

The infrared transmit module 3 on the mobile terminal is disposed on a periphery of the lens module 22. The infrared transmit module 3 emits infrared light, and the infrared light is reflected after encountering an obstacle. After the imaging system 2 captures the reflected infrared light, and photoelectric conversion is performed by using the infrared subpixel, a time difference from transmitting the infrared light to receiving the infrared light can be obtained. Due to a fixed light propagation speed, a distance between the obstacle and the mobile terminal may be obtained, and a distance from each minimum unit on the obstacle to the mobile terminal may be finally obtained, to implement a stereo imaging and recording function. Certainly, a distance between each infrared light reflection point on the obstacle and the mobile terminal may be further obtained by obtaining a phase difference of the infrared light.

For the mobile terminal in this embodiment of the present disclosure, the image sensor is formed by using a 2PD pixel array combining an RGB subpixel and an infrared subpixel that are in a four-in-one arrangement. Capturing is performed by using the image sensor, and a distance between the to-be-captured object and the mobile terminal may be detected when an image is captured and recorded, thereby achieving fast focusing and bokeh. In addition, a dark-state imaging effect of the image can be improved, and a related application function of stereophotographing is implemented thereby ensuring functional diversity of the mobile terminal while capturing experience of a user is ensured.

Figure 8:
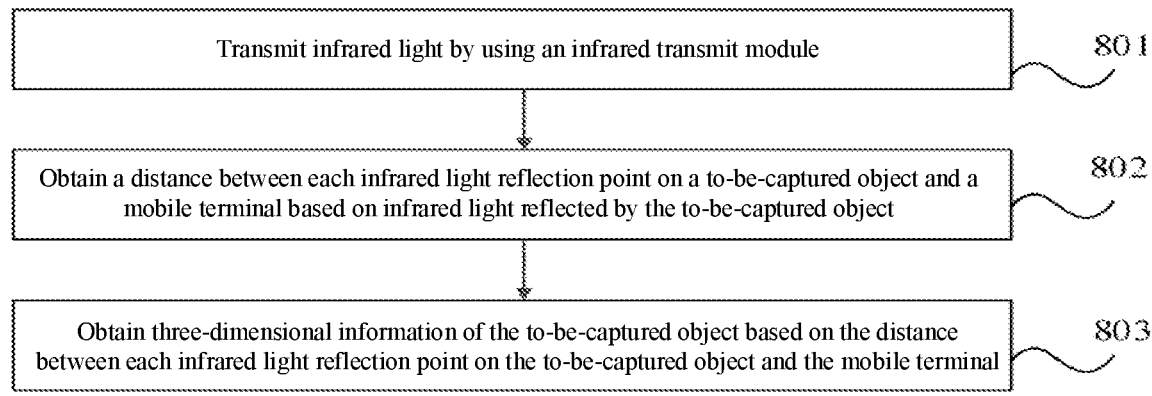
FIG. 8 is a schematic diagram of an image capturing method according to an embodiment of the present disclosure.

An embodiment of the present disclosure further provides an image capturing method, applied to a mobile terminal. In addition to the foregoing image sensor, the mobile terminal further includes an infrared transmit module. As shown in FIG. 8, the method includes:

Step 801. Transmit infrared light by using the infrared transmit module.

The infrared transmit module on the mobile terminal can emit infrared light. After encountering a to-be-captured object, the infrared light is reflected, and the reflected infrared light is received by an imaging system of the mobile terminal. The image sensor of the mobile terminal forms a four-in-one RGB-IR pixel array. Therefore, photoelectric conversion can be performed by using an infrared subpixel.

Step 802. Obtain a distance between each infrared light reflection point on a to-be-captured object and the mobile terminal based on the infrared light reflected by the to-be-captured object.

When the distance between the to-be-captured object and the mobile terminal is obtained, a distance between the to-be-captured object and an imaging surface is actually obtained. A process of obtaining the distance between each infrared light reflection point on the to-be-captured object and the mobile terminal is as follows: receiving, by using a pixel array including a second pixel, the infrared light reflected by each infrared light reflection point on the to-be-captured object; and according to the time difference between sending and receiving the infrared light and a propagation speed of the infrared light or by obtaining the phase difference of the infrared light, obtaining the distance between each infrared light reflection point on the to-be-captured object and the mobile terminal.

After the reflected infrared light is captured, and photoelectric conversion is performed by using the infrared subpixel, the time difference from transmitting the infrared light to receiving the infrared light can be obtained. Due to the fixed light propagation speed, the distance between the obstacle and the mobile terminal may be obtained based on ½ of a product of the time difference and the propagation speed. Time points at which the mobile terminal receives infrared light reflected by the infrared light reflection points are different. Therefore, a distance may be correspondingly calculated for each infrared light reflection point, so that the distance between each infrared light reflection point and the mobile terminal may be obtained. The distance between each infrared light reflection point and the mobile terminal may be further obtained by obtaining the phase difference of the infrared light. For details, refer to a time of flight (Time of Flight, TOF) technology. Details are not described herein.

The pixel array of the image sensor in this embodiment of the present disclosure includes a preset quantity of pixel units arranged in a predetermined manner, the pixel unit includes a first pixel and a second pixel, the first pixel includes a red subpixel, a green subpixel, and a blue subpixel, the second pixel includes the green subpixel, an infrared subpixel, and at least one of the red subpixel or the blue subpixel, both the first pixel and the second pixel are dual pixel focusing pixels, and each subpixel in the first pixel and the second pixel is arranged in a four-in-one manner. A position of the infrared subpixel in the second pixel is the same as a position of the red subpixel, the green subpixel, the blue subpixel, a first combination of subpixels, or a second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other. Alternatively, a position of half the infrared subpixel in the second pixel is the same as a position of half the red subpixel, half the green subpixel, or half the blue subpixel in the first pixel, and half an infrared subpixel in each of two adjacent second pixels is combined to form an entire infrared subpixel.

Step 803. Obtain three-dimensional information of the to-be-captured object based on the distance between each infrared light reflection point on the to-be-captured object and the mobile terminal.

When the distance between each infrared light reflection point on the to-be-captured object and the mobile terminal is obtained, a distance from each minimum unit on the to-be-captured object to the mobile terminal is specifically obtained, and then a process of capturing the to-be-captured object is executed, to implement a stereo imaging and recording function.

For the image capturing method in this embodiment of the present disclosure, the image sensor is formed by using a 2PD pixel array combining an RGB subpixel and an infrared subpixel that are in a four-in-one arrangement. Capturing is performed by using the image sensor, and a distance between the to-be-captured object and the mobile terminal may be detected when an image is captured and recorded, thereby achieving fast focusing and bokeh. In addition, a dark-state imaging effect of the image can be improved, and a related application function of stereophotographing is implemented thereby ensuring functional diversity of the mobile terminal while capturing experience of a user is ensured.

Figure 9:
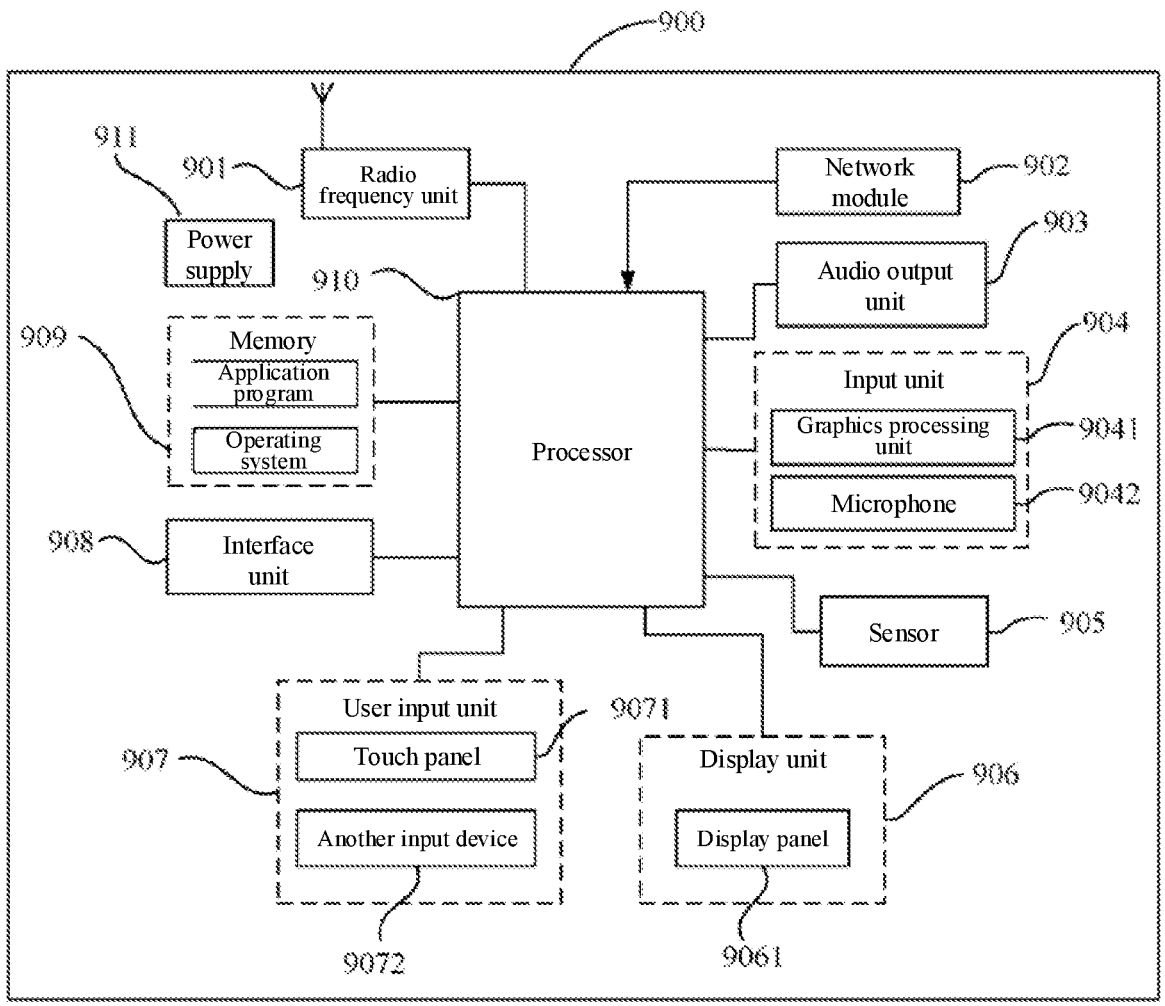
FIG. 9 is a schematic diagram of a hardware structure of a mobile terminal according to an embodiment of the present disclosure.

FIG. 9 is a schematic diagram of a hardware structure of a mobile terminal according to various embodiments of the present disclosure. The mobile terminal 900 includes, but is not limited to: a radio frequency unit 901, a network module 902, an audio output unit 903, an input unit 904, a sensor 905, a display unit 906, a user input unit 907, an interface unit 908, a memory 909, a processor 910, a power supply 911, and other components.

The mobile terminal 900 further includes an imaging system and an infrared transmit module. The imaging system includes an image sensor and a lens module; a driver module configured to drive the lens module to move; a filtering module disposed between the lens module and the image sensor; an image data processing module connected to the image sensor; and a display module connected to the image data processing module, where the infrared transmit module is disposed on a periphery of the lens module.

The filtering module can pass through an optical wavelength from 380 nm to 1100 nm.

The image sensor includes: a pixel array, where the pixel array includes a preset quantity of pixel units arranged in a predetermined manner, the pixel unit includes a first pixel and a second pixel adjacent to the first pixel, the first pixel includes a red subpixel, a green subpixel, and a blue subpixel, the second pixel includes the green subpixel, an infrared subpixel, and at least one of the red subpixel or the blue subpixel, both the first pixel and the second pixel are dual pixel focusing pixels, and each subpixel in the first pixel and the second pixel is arranged in a four-in-one manner; and a position of the infrared subpixel in the second pixel is the same as a position of the red subpixel, the green subpixel, the blue subpixel, a first combination of subpixels, or a second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other; or a position of half the infrared subpixel in the second pixel is the same as a position of half the red subpixel, half the green subpixel, or half the blue subpixel in the first pixel, and half an infrared subpixel in each of two adjacent second pixels is combined to form an entire infrared subpixel.

When the position of the infrared subpixel in the second pixel is the same as the position of the red subpixel, the green subpixel, the blue subpixel, the first combination of subpixels, or the second combination of subpixels in the first pixel, the pixel unit includes one second pixels and at least one first pixel.

When the position of half the infrared subpixel in the second pixel is the same as the position of half the red subpixel, half the green subpixel, or half the blue subpixel in the first pixel, and half the infrared subpixel in each of two adjacent second pixels is combined to form the entire infrared subpixel, the pixel unit includes two second pixels and the first pixel whose quantity is greater than or equal to zero.

The red subpixel includes a semiconductor layer, a metal layer, a photodiode, a red light filter, and a micromirror that are sequentially stacked; the green subpixel includes a semiconductor layer, a metal layer, a photodiode, a green light filter, and a micromirror that are sequentially stacked; the blue subpixel includes a semiconductor layer, a metal layer, a photodiode, a blue light filter, and a micromirror that are sequentially stacked; the infrared subpixel includes a semiconductor layer, a metal layer, a photodiode, an infrared light filter, and a micromirror that are sequentially stacked.

The image sensor is a complementary metal oxide semiconductor CMOS image sensor, a charge-coupled device CCD image sensor, or a quantum film image sensor.

A person skilled in the art may understand that a structure of the mobile terminal shown in FIG. 9 does not constitute a limitation on the mobile terminal, and the mobile terminal may include more or fewer components than those shown in the figure, or combine some components, or have different component arrangements. In this embodiment of the present disclosure, the mobile terminal includes, but is not limited to, a mobile phone, a tablet computer, a laptop computer, a palmtop computer, an in-vehicle terminal, a wearable device, a pedometer, and the like.

The processor 910 is configured to: transmit infrared light by using the infrared transmit module; obtain a distance between each infrared light reflection point on a to-be-captured object and the mobile terminal based on the infrared light reflected by the to-be-captured object; and control, based on the distance between each infrared light reflection point on the to-be-captured object and the mobile terminal, the imaging system to obtain three-dimensional information of the to-be-captured object.

In this way, the image sensor is formed by using a 2PD pixel array combining an RGB subpixel and an infrared subpixel that are in a four-in-one arrangement. Capturing is performed by using the image sensor, and a distance between the to-be-captured object and the mobile terminal may be detected when an image is captured and recorded, thereby achieving fast focusing and bokeh. In addition, a dark-state imaging effect of the image can be improved, and a related application function of stereophotographing is implemented thereby ensuring functional diversity of the mobile terminal while capturing experience of a user is ensured.

It should be understood that in this embodiment of the present disclosure, the radio frequency unit 901 may be configured to receive and send signals in a process of receiving and sending information or calling. Specifically, after receiving downlink data from a base station, the radio frequency unit 901 sends the downlink data to the processor 910 for processing; and sends uplink data to the base station. Generally, the radio frequency unit 901 includes, but is not limited to, an antenna, at least one amplifier, a transceiver, a coupler, a low noise amplifier, a duplexer, and the like. In addition, the radio frequency unit 901 may further communicate with a network and another device by using a wireless communications system.

The mobile terminal provides wireless broadband Internet access for a user by using a network module 902, for example, helping the user send and receive an email, browse a web page, and access streaming media.

The audio output unit 903 may convert audio data received by the radio frequency unit 901 or the network module 902 or stored in the memory 909 into an audio signal and output the audio signal as sound. Moreover, the audio output unit 903 may further provide audio output (for example, call signal receiving sound and message receiving sound) related to a specific function executed by the mobile terminal 900. The audio output unit 903 includes a speaker, a buzzer, a telephone receiver, and the like.

The input unit 904 is configured to receive an audio signal or a video signal. The input unit 904 may include a graphics processing unit (Graphics Processing Unit, GPU) 9041 and a microphone 9042. The graphics processing unit 9041 is configured to process image data of a static picture or a video obtained by an image capturing apparatus (for example, a camera) in video capturing mode or image capturing mode. An image frame obtained through processing may be displayed on the display unit 906. The display unit herein is the display module. The image frame obtained through processing by the graphics processing unit 9041 may be stored in the memory 909 (or another storage medium) or sent by using the radio frequency unit 901 or the network module 902. The graphics processing unit 9041 is the image data processing module. The microphone 9042 may receive sound and can process such sound into audio data. The audio data obtained through processing may be converted, in a telephone call mode, into a format that can be sent to a mobile communications base station via the radio frequency unit 901 for output.

The mobile terminal 900 further includes at least one sensor 905, such as an optional sensor, a motion sensor, and another sensor. Specifically, the optional sensor includes an ambient light sensor and a proximity sensor. The ambient light sensor may adjust luminance of the display panel 9061 based on brightness of ambient light, and the proximity sensor may disable the display panel 9061 and/or backlight when the mobile terminal 900 approaches an ear. As a type of the motion sensor, an accelerometer sensor may detect magnitude of an acceleration in each direction (generally three axes), and may detect magnitude and a direction of gravity when being static. The accelerometer sensor may be used for recognizing a gesture of a mobile terminal (for example, horizontal and vertical screen switching, a related game, or magnetometer posture calibration), a function related to vibration recognition (for example, a pedometer or a strike), or the like. The sensor 905 may further include a fingerprint sensor, a pressure sensor, an iris sensor, a molecular sensor, a gyroscope, a barometer, a hygrometer, a thermometer, an infrared sensor, and the like. Details are not described herein.

The display unit 906 is configured to display information entered by a user or information provided for the user. The display unit 906 may include a display panel 9061, and the display panel 9061 may be configured in a form of a liquid crystal display (Liquid Crystal Display, LCD), an organic light-emitting diode (Organic Light-Emitting Diode, OLED), or the like.

The user input unit 907 may be configured to receive input digit or character information and generate key signal input related to user setting and function control of the mobile terminal. Specifically, the user input unit 907 includes a touch panel 9071 and another input device 9072. The touch panel 9071, also referred to as a touch screen, may collect a touch operation of a user on or near the touch panel 9071 (for example, the user uses any suitable object or accessory such as a finger or a stylus to operate on or near the touch panel 9071). The touch panel 9071 may include two parts: a touch detection apparatus and a touch controller. The touch detection apparatus detects a touch position of the user, detects a signal brought by the touch operation, and transmits the signal to the touch controller. The touch controller receives touch information from the touch detection apparatus, converts the touch information into contact coordinates, transmits the contact coordinates to the processor 910, receives a command sent by the processor 910, and executes the command. In addition, the touch panel 9071 may be implemented in various types such as resistive, capacitive, infrared, and surface acoustic wave. In addition to the touch panel 9071, the user input unit 907 may further include the another input device 9072. Specifically, the another input device 9072 may include, but is not limited to, a physical keyboard, function keys (such as a volume control key and a switch key), a trackball, a mouse, and a joystick. Details are not described herein.

Further, the touch panel 9071 can cover the display panel 9061. When detecting a touch operation on or near the touch panel 9071, the touch panel 9071 transmits the touch operation to the processor 910 to determine a type of a touch event. Then the processor 910 provides corresponding visual output on the display panel 9061 based on the type of the touch event. In FIG. 9, the touch panel 9071 and the display panel 9061 are used as two independent components to implement input and output functions of the mobile terminal. However, in some embodiments, the touch panel 9071 and the display panel 9061 may be integrated to implement the input and output functions of the mobile terminal. This is not specifically limited herein.

The interface unit 908 is an interface connecting an external apparatus to the mobile terminal 900. For example, the external apparatus may include a wired or wireless headset port, an external power supply (or a battery charger) port, a wired or wireless data port, a memory card port, a port for connecting an apparatus having an identification module, an audio input/output (I/O) port, a video I/O port, a headset port, and the like. The interface unit 908 may be configured to receive input (such as data information and power) from the external apparatus and transmit the received input to one or more elements in the mobile terminal 900, or may be configured to transmit data between the mobile terminal 900 and the external apparatus.

The memory 909 may be configured to store a software program and various data. The memory 909 may mainly include a program storage area and a data storage area. The program storage area may store an operating system, an application program required by at least one function (such as a sound play function or an image display function), and the like. The data storage area may store data (such as audio data or an address book) or the like created based on use of the mobile phone. In addition, the memory 909 may include a high-speed random access memory, and may further include a non-volatile memory, such as at least one magnetic disk storage device, a flash memory device, or another volatile solid-state storage device.

The processor 910 is a control center of the mobile terminal, and is connected to all parts of the entire mobile terminal by using various interfaces and lines, and performs various functions of the mobile terminal and processes data by running or executing the software program and/or the module that are/is stored in the memory 909 and invoking the data stored in the memory 909, to implement overall monitoring on the mobile terminal. The processor 910 may include one or more processing units. Optionally, the processor 910 may integrate an application processor with a modem processor. The application processor mainly processes the operating system, a user interface, the application program, and the like, and the modem processor mainly processes wireless communication. It may be understood that the foregoing modem processor may not be integrated into the processor 910.

The mobile terminal 900 may further include a power supply 911 (such as a battery) that supplies power to each component. Optionally, the power supply 911 may be logically connected to the processor 910 by using a power management system, to implement functions such as charging, discharging, and power consumption management by using the power management system.

In addition, the mobile terminal 900 includes some function modules not shown, and details are not described herein.

It should be noted that in this specification, the terms "comprise", "include", and any other variants thereof are intended to cover non-exclusive inclusion, so that a process, a method, an article, or an apparatus that includes a series of elements not only includes these very elements, but may also include other elements not expressly listed, or also include elements inherent to this process, method, article, or apparatus. Without being subject to further limitations, an element defined by a phrase "including a" does not exclude presence of other identical elements in the process, method, article, or apparatus that includes the very element.

By means of the foregoing description of the embodiments, a person skilled in the art may clearly understand that the method in the foregoing embodiments may be implemented by software with a necessary general hardware platform. Certainly, the method in the foregoing embodiments may also be implemented by hardware. However, in many cases, the former is a preferred implementation. Based on such an understanding, the technical solutions of the present disclosure essentially or the part contributing to related technologies may be implemented in a form of a software product. The computer software product is stored in a storage medium (such as a read-only memory (Read-only Memory, ROM)/random access memory (Random Access Memory, RAM), a magnetic disk, or an optical disc) and includes several instructions for instructing user equipment (which may be a mobile phone, a computer, a server, an air conditioner, or a network device) to execute the methods described in the embodiments of the present disclosure.

The embodiments of the present disclosure are described above with reference to the accompanying drawings, but the present disclosure is not limited to the foregoing specific implementations. The foregoing specific implementations are merely schematic instead of restrictive. Under enlightenment of the present disclosure, a person of ordinary skills in the art may make many forms without departing from the protection scope of aims and claims of the present disclosure, all of which fall within the protection of the present disclosure.

The invention claimed is:

1. An image sensor, comprising:
a pixel array, wherein the pixel array comprises a preset quantity of pixel units arranged in a predetermined manner, the pixel unit comprises a first pixel and at least one second pixel adjacent to the first pixel, the first pixel comprises a red subpixel, a green subpixel, and a blue subpixel, each of the at least one second pixel comprises the green subpixel, an infrared subpixel, and at least one of the red subpixel or the blue subpixel, both the first pixel and the at least one second pixel are dual pixel focusing pixels, and each subpixel in the first pixel and the at least one second pixel is arranged in a four-in-one manner, wherein
a position of the infrared subpixel in the at least one second pixel is the same as a position of the red subpixel, the green subpixel, the blue subpixel, a first combination of subpixels, or a second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other; or
a position of half the infrared subpixel in the at least one second pixel is the same as a position of half the red subpixel, half the green subpixel, or half the blue subpixel in the first pixel, and half an infrared subpixel in each of two adjacent second pixels of the at least one second pixel is combined to form the entire infrared subpixel.

2. The image sensor according to claim 1, wherein when the position of the infrared subpixel in the at least one second pixel is the same as the position of the red subpixel, the green subpixel, the blue subpixel, the first combination of subpixels, or the second combination of subpixels in the first pixel, the pixel unit comprises one second pixel and at least one first pixel.

3. The image sensor according to claim 1, wherein when the position of half the infrared subpixel in the at least one second pixel is the same as the position of half the red subpixel, half the green subpixel, or half the blue subpixel in the first pixel, and half an infrared subpixel in each of two adjacent second pixels of the at least one second pixel is combined to form the entire infrared subpixel, the pixel unit comprises two second pixels and the first pixel whose quantity is greater than or equal to zero.

4. The image sensor according to claim 1, wherein
the red subpixel comprises a semiconductor layer, a metal layer, a photodiode, a red light filter, and a microlens that are sequentially stacked;
the green subpixel comprises a semiconductor layer, a metal layer, a photodiode, a green light filter, and a microlens that are sequentially stacked;
the blue subpixel comprises a semiconductor layer, a metal layer, a photodiode, a blue light filter, and a microlens that are sequentially stacked; and
the infrared subpixel comprises a semiconductor layer, a metal layer, a photodiode, an infrared light filter, and a microlens that are sequentially stacked.

5. The image sensor according to claim 1, wherein the image sensor is a complementary metal oxide semiconductor (CMOS) image sensor, a charge-coupled device (CCD) image sensor, or a quantum film image sensor.

6. A mobile terminal, comprising an imaging system and an infrared transmit module, wherein the imaging system comprises:
an image sensor;
a lens module;
a driver module configured to drive the lens module to move;
a filtering module disposed between the lens module and the image sensor;
an image data processing module connected to the image sensor; and
a display module connected to the image data processing module, wherein
the infrared transmit module is disposed on a periphery of the lens module;
wherein the image sensor comprises:
a pixel array, wherein the pixel array comprises a preset quantity of pixel units arranged in a predetermined manner, the pixel unit comprises a first pixel and at least one second pixel adjacent to the first pixel, the first pixel comprises a red subpixel, a green subpixel, and a blue subpixel, each of the at least one second pixel comprises the green subpixel, an infrared subpixel, and at least one of the red subpixel or the blue subpixel, both the first pixel and the at least one second pixel are dual pixel focusing pixels, and each subpixel in the first pixel and the at least one second pixel is arranged in a four-in-one manner, wherein
a position of the infrared subpixel in the at least one second pixel is the same as a position of the red subpixel, the green subpixel, the blue subpixel, a first combination of subpixels, or a second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other; or
a position of half the infrared subpixel in the at least one second pixel is the same as a position of half the red subpixel, half the green subpixel, or half the blue subpixel in the first pixel, and half an infrared subpixel in each of two adjacent second pixels of the at least one second pixel is combined to form the entire infrared subpixel.

7. The mobile terminal according to claim 6, wherein the filtering module is capable of passing through an optical wavelength from 380 nm to 1100 nm.

8. The mobile terminal according to claim 6, wherein when the position of the infrared subpixel in the at least one second pixel is the same as the position of the red subpixel, the green subpixel, the blue subpixel, the first combination of subpixels, or the second combination of subpixels in the first pixel, the pixel unit comprises one second pixel and at least one first pixel.

9. The mobile terminal according to claim 6, wherein when the position of half the infrared subpixel in the at least one second pixel is the same as the position of half the red subpixel, half the green subpixel, or half the blue subpixel in the first pixel, and half an infrared subpixel in each of two adjacent second pixels of the at least one second pixel is combined to form the entire infrared subpixel, the pixel unit comprises two second pixels and the first pixel whose quantity is greater than or equal to zero.

10. The mobile terminal according to claim 6, wherein
the red subpixel comprises a semiconductor layer, a metal layer, a photodiode, a red light filter, and a microlens that are sequentially stacked;
the green subpixel comprises a semiconductor layer, a metal layer, a photodiode, a green light filter, and a microlens that are sequentially stacked;
the blue subpixel comprises a semiconductor layer, a metal layer, a photodiode, a blue light filter, and a microlens that are sequentially stacked; and
the infrared subpixel comprises a semiconductor layer, a metal layer, a photodiode, an infrared light filter, and a microlens that are sequentially stacked.

11. The mobile terminal according to claim 6, wherein the image sensor is a complementary metal oxide semiconductor (CMOS) image sensor, a charge-coupled device (CCD) image sensor, or a quantum film image sensor.

12. An image capturing method, applied to a mobile terminal comprising an infrared transmit module and an image sensor,
wherein the image sensor comprises:
a pixel array, wherein the pixel array comprises a preset quantity of pixel units arranged in a predetermined manner, the pixel unit comprises a first pixel and at least one second pixel adjacent to the first pixel, the first pixel comprises a red subpixel, a green subpixel, and a blue subpixel, each of the at least one second pixel comprises the green subpixel, an infrared subpixel, and at least one of the red subpixel or the blue subpixel, both the first pixel and the at least one second pixel are dual pixel focusing pixels, and each subpixel in the first pixel and the at least one second pixel is arranged in a four-in-one manner, wherein
a position of the infrared subpixel in the at least one second pixel is the same as a position of the red subpixel, the green subpixel, the blue subpixel, a first combination of subpixels, or a second combination of subpixels in the first pixel, the first combination of subpixels is a combination of half a red subpixel and half a green subpixel that are adjacent to each other, and the second combination of subpixels is a combination of half a green subpixel and half a blue subpixel that are adjacent to each other; or
a position of half the infrared subpixel in the at least one second pixel is the same as a position of half the red subpixel, half the green subpixel, or half the blue subpixel in the first pixel, and half an infrared subpixel in each of two adjacent second pixels of the at least one second pixel is combined to form the entire infrared subpixel;
wherein the method comprises:
transmitting infrared light by using the infrared transmit module;
obtaining a distance between each infrared light reflection point on a to-be-captured object and the mobile terminal based on infrared light reflected by the to-be-captured object; and
obtaining three-dimensional information of the to-be-captured object based on the distance between each infrared light reflection point on the to-be-captured object and the mobile terminal.

* * * * *